(12) United States Patent
Nakayama et al.

(10) Patent No.: US 8,309,974 B2
(45) Date of Patent: Nov. 13, 2012

(54) LIGHT EMITTING DIODE PACKAGE

(75) Inventors: Katsuyoshi Nakayama, Tokyo (JP);
Akihiro Hishinuma, Koriyama (JP);
Rui Yanagawa, Koriyama (JP);
Kazuyoshi Orihara, Tokyo (JP);
Yasuko Osaki, Tokyo (JP); Kenji Imakita, Tokyo (JP); Takashi Ootsuki, Tokyo (JP); Hideaki Hayashi, Tokyo (JP); Shinji Honda, Koriyama (JP)

(73) Assignee: Asahi Glass Company, Limited, Tokyo (JP)

( * ) Notice: Subject to any disclaimer, the term of this patent is extended or adjusted under 35 U.S.C. 154(b) by 121 days.

(21) Appl. No.: 12/881,204

(22) Filed: Sep. 14, 2010

(65) Prior Publication Data

US 2011/0001162 A1 Jan. 6, 2011

Related U.S. Application Data

(63) Continuation of application No. PCT/JP2009/056976, filed on Apr. 3, 2009.

(30) Foreign Application Priority Data

Apr. 18, 2008 (JP) ................. 2008-108953

(51) Int. Cl.
*H01L 27/15* (2006.01)
*H01L 29/267* (2006.01)
*H01L 31/12* (2006.01)
(52) U.S. Cl. .......................... 257/81; 257/433
(58) Field of Classification Search .............. 257/79, 257/81, 432, 433, E33.001
See application file for complete search history.

(56) References Cited

U.S. PATENT DOCUMENTS

| | | | |
|---|---|---|---|
| 7,550,319 B2 | 6/2009 | Wang et al. | |
| 2008/0043444 A1 | 2/2008 | Hasegawa et al. | |
| 2011/0140154 A1* | 6/2011 | Nakayama et al. | 257/98 |
| 2011/0204398 A1* | 8/2011 | Tanida et al. | 257/98 |
| 2011/0241043 A1* | 10/2011 | Nakayama | 257/98 |
| 2011/0241049 A1* | 10/2011 | Tanida et al. | 257/98 |
| 2011/0293874 A1* | 12/2011 | Toyooka et al. | 428/49 |
| 2012/0018759 A1* | 1/2012 | Ohta | 257/98 |

FOREIGN PATENT DOCUMENTS

| | | |
|---|---|---|
| JP | 01-226750 | 9/1989 |
| JP | 01-252548 | 10/1989 |
| JP | 2006-041230 | 2/2006 |

(Continued)

OTHER PUBLICATIONS

U.S. Appl. No. 12/953,563, filed Nov. 24, 2010, Nakayama, et al.

(Continued)

*Primary Examiner* — S. V. Clark
(74) *Attorney, Agent, or Firm* — Oblon, Spivak, McClelland, Maier & Neustadt, L.L.P.

(57) ABSTRACT

To provide a light emitting diode package of which the height of protrusion of a thermal via is decreased without decreasing the flexural strength of an insulating substrate.
A light emitting diode package comprising a light emitting diode element mounted on a substrate, wherein the substrate is obtained by firing a glass ceramic composition containing a powder of glass containing, as represented by mole percentage, from 57 to 65% of $SiO_2$, from 13 to 18% of $B_2O_3$, from 9 to 23% of CaO, from 3 to 8% of $Al_2O_3$ and from 0.5 to 6% of at least one of $K_2O$ and $Na_2O$ in total, and a ceramic filler.

13 Claims, 1 Drawing Sheet

FOREIGN PATENT DOCUMENTS

| | | |
|---|---|---|
| JP | 2006-210677 | 8/2006 |
| JP | 2007-121613 | 5/2007 |
| JP | 2007-129191 | 5/2007 |
| JP | 2007-226034 | 9/2007 |
| JP | 2007-266172 | 10/2007 |
| JP | 2008-004646 | 1/2008 |

OTHER PUBLICATIONS

U.S. Appl. No. 13/075,571, filed Mar. 30, 2011, Tanida, et al.

* cited by examiner

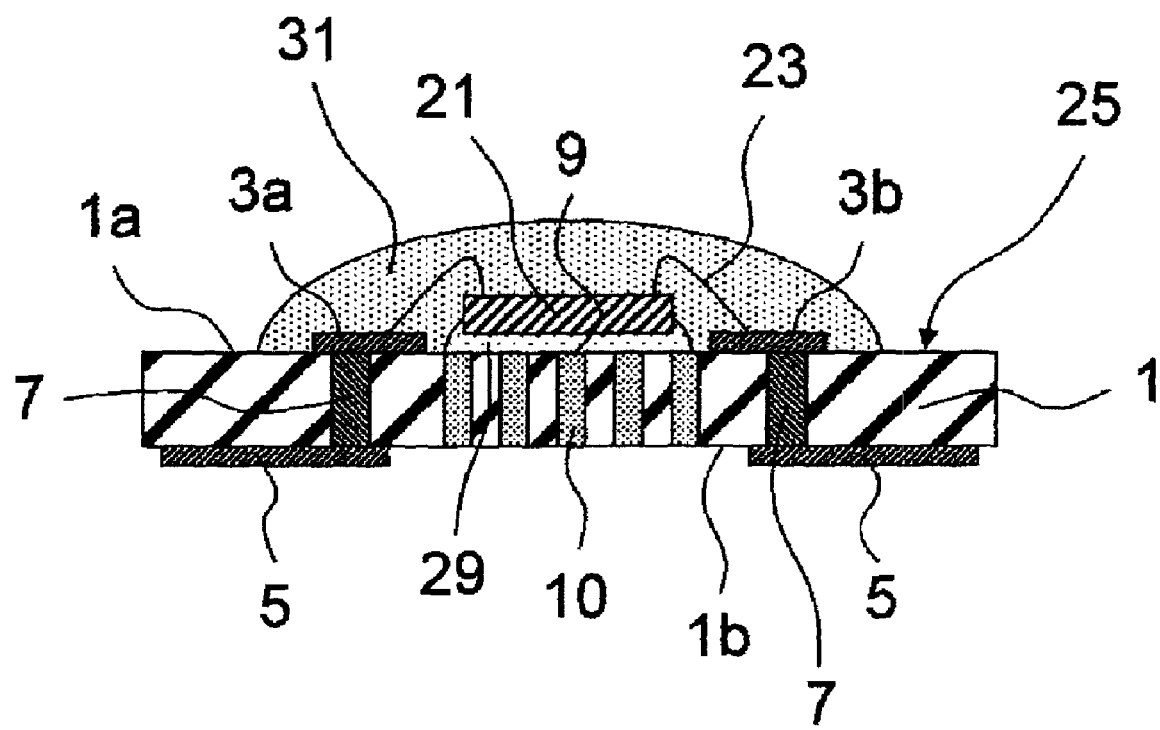

LIGHT EMITTING DIODE PACKAGE

TECHNICAL FIELD

The present invention relates to a light emitting diode package suitable for formation of illumination devices such as a light emitting diode device, a high brightness (HB) photodiode backlight, a light source related to displays, automobile illumination, decorative illumination, sign and advertisement illumination, and an information display, and an insulating substrate to be used therefor. Here, a light emitting diode package includes an insulating substrate on which a light emitting diode chip is mounted and a reflector, and will sometimes be referred to as a light emitting device in the present specification.

BACKGROUND ART

In recent years, along with a tendency to high brightness and whitening of a light emitting element such as a light emitting diode (hereinafter sometimes referred to as LED) device, a light emitting device employing LED for a backlight of a mobile phone, a large sized liquid crystal TV, etc. has been used.

However, along with a tendency to high brightness of a light emitting element, heat generated from a light emitting device is also increasing. Therefore, in order to be free from a decrease in the brightness of a light emitting element due to an increase in the temperature, a substrate for a light emitting element and an LED package (hereinafter sometimes referred to simply as a package) having high heat dissipation properties such that generated heat is quickly dissipated from a light emitting element have been desired.

As a substrate for a light emitting device, heretofore, an alumina substrate which has been used as an insulating substrate for a wiring board has been used in many cases, but an alumina substrate has a problem such as a low thermal conductivity of about from 15 to 20 W/m·K.

Further, as a substrate which replaces the alumina substrate, attention started being paid to an aluminum nitride substrate having a high thermal conductivity. However, an aluminum nitride substrate had a problem of a high cost of raw materials and a low coefficient of thermal expansion of from $4\times10^{-6}$ to $5\times10^{-6}/°$ C., and thereby had a problem such that when mounted on a printed board having a coefficient of thermal expansion of at least $9\times10^{-6}/°$ C. as a universal product, connection reliability will be decreased by a large difference in the coefficient of thermal expansion. Further, since an alumina substrate and an aluminum nitride substrate are hardly sintered, high temperature firing will be required, thus leading to an increase in the process cost.

In order to solve such problems, a low temperature co-fired ceramic substrate (hereinafter sometimes referred to as an LTCC or an LTCC substrate) started being used as an LED package substrate.

An LTCC comprises glass and a ceramic filler such as an alumina filler, provides a large difference between the refractive index of the glass and the refractive index of the ceramic filler, provides a large area of an interface which reflects light since the number of the ceramic filler components dispersed in the LTCC is large, and further has a high reflectance since the thickness of the glass or the ceramic filler at both sides of the interface is larger than the wavelength of the light. Accordingly, the LTCC can efficiently reflect light from a light emitting device, and as a result, heat generation can be decreased.

Further, since the LTCC is formed by an inorganic oxide, it is free from deterioration by a light source unlike a resin substrate, and can stably maintain the color tone over a long period of time.

However, since the LTCC cannot be said to have a sufficiently high thermal conductivity, it is likely to cause a decrease in the brightness of a light emitting element. In order to solve this problem, heretofore, it has been known to reduce the thermal resistance by providing a through hole conductor for heat dissipation i.e. a thermal via which transfers heat from the LED to a heatsink on the opposite side of the substrate. Here, the through hole conductor is also called a via conductor.

FIG. 1 is a transcription of FIG. 2 in Patent Document 1 as an example of a conventional light emitting diode package. Just under an LED chip (LED element) 21 as a light emitting element, a through hole conductor (thermal via) 10 is located, and the LED chip 21 is attached on the thermal via 10 by means of an adhesive 29. In order to realize low thermal resistance from the LED to the rear side of a substrate, a via having a relatively large diameter is required. Since the amount of heat which can be transferred by a single thermal via is limited by its diameter, a large number of thermal vias are usually formed in the substrate.

The LTCC is usually prepared by adding a resin and the like to a raw material powder containing a glass powder and a ceramic filler (ceramic powder) as the main components and forming the mixture into a sheet, which is fired at a temperature of at most 1,000° C. to obtain a substrate. The above sheet-form product is called a green sheet, and processing such as cutting or punching is applied thereto as the case requires, a conductor is printed thereon by using a conductor paste, and usually a plurality of such sheets are laminated, followed by firing.

The LTCC can be prepared in such a manner that a powder of a silver conductor or a copper conductor having a high thermal conductivity is formed into a paste, which is e.g. embedded in a through hole provided on the green sheet, followed by co-firing with a silver conductor or a copper conductor, and accordingly a substrate provided with a through hole conductor excellent in heat dissipation properties can efficiently be produced.

Patent Document 1: JP-A-2006-41230

DISCLOSURE OF THE INVENTION

Object to be Accomplished by the Invention

In a case where an LED package structure as shown in FIG. 1 is employed as a conventional example, when the flexural strength as described hereinafter is to be increased, a thermal via protrudes from the LTCC substrate at the time of co-firing to form a protrusion, and the LED chip is attached to the protrusion of the thermal via by means of an adhesive. However, if the protrusion of the thermal via is high, a large amount of the adhesive should be used, thus leading to an increase in the thermal resistance. Accordingly, an LED package with a high flexural strength and a low protrusion of the thermal via has been required.

It is an object of the present invention to provide an LED package which solves such a problem.

Means to Accomplish the Object

The present invention provides a light emitting diode package comprising a light emitting diode element mounted on a substrate, wherein the substrate is obtained by firing a glass ceramic composition containing a powder of glass containing, as represented by mole percentage, from 57 to 65% of $SiO_2$, from 13 to 18% of $B_2O_3$, from 9 to 23% of CaO, from 3 to 8% of $Al_2O_3$ and from 0.5 to 6% of at least one of $K_2O$ and $Na_2O$ in total, and a ceramic filler.

Further, it provides the above light emitting diode package, wherein a heatsink is formed on the other side of the substrate opposite to the side where the light emitting diode element is mounted, and at least one through hole conductor on which the light emitting diode element is mounted is a thermal via connected to the heatsink, that is, a light emitting diode package wherein a light emitting diode element on one side of a substrate having a thermal via and a heatsink formed on the other side of the substrate are connected by at least one of said thermal via formed in the substrate, wherein the substrate is obtained by firing a glass ceramic composition containing a power of glass containing, as represented by mole percentage, from 57 to 65% of $SiO_2$, from 13 to 18% of $B_2O_3$, from 9 to 23% of CaO, from 3 to 8% of $Al_2O_3$ and from 0.5 to 6% of $K_2O+Na_2O$, and a ceramic filler.

Here, the light emitting diode element will sometimes be referred to as a light emitting diode chip or simply as a chip, and the substrate will sometimes be referred to as an insulating substrate.

Further, the present invention provides the above light emitting diode package wherein the ceramic filler is an alumina powder.

Further, the present invention provides the above light emitting diode package wherein the ceramic filler contains an alumina powder and a zirconium powder.

Further, the present invention provides the above light emitting diode package wherein the flexural strength of the substrate is at least 250 MPa.

Further, the present invention provides the above light emitting diode package wherein the conductor of the thermal via protrudes from the side of the substrate on which the light emitting diode element is mounted, and the amount of protrusion is at most 5 µm, that is, the above light emitting diode package wherein the conductor of the thermal via which connects the light emitting diode element to the heatsink, is protruded from the side of the substrate on which the light emitting diode element is mounted, and the amount of protrusion is at most 5 µm.

The substrate or the LED package in the present invention is, after a chip is mounted, cut by folding a notched portion or cut by so-called dicing by a diamond abrasive grain after firing the substrate. On that occasion, if the substrate itself is also broken or chipping (cracking) occurs, the package will be broken, thus leading to an increase in the cost. Accordingly, a high flexural strength of the substrate, typically at least 250 MPa, is required. The flexural strength is usually 400 MPa in the case of an alumina substrate or 300 MPa in the case of an aluminum nitride substrate.

Further, the substrate in the present invention is preferably excellent in acid resistance. The reason is that plating or the like is applied to the substrate in some cases, and for that purpose, the substrate is treated with an acidic plating liquid or the like in some cases.

The present inventors have found that when an LTCC substrate was prepared by using a powder of glass (glass in after-mentioned Example 15) containing, as represented by mol %, 81.6% of $SiO_2$, 16.6% of $B_2O_3$ and 1.8% of $K_2O$ and an alumina powder, favorable acid resistance was obtained, and no phenomenon such that the through hole conductor greatly protrudes was confirmed, but the flexural strength was so low as 190 MPa.

Accordingly, CaO and $Al_2O_3$ were added to the above glass composition, whereupon the flexural strength was 250 MPa, and the strength could be improved (glass in after-mentioned Example 13). The present inventors have considered that this is because the crystallization tendency of glass is increased. They consider that the precipitated crystalline phase comprises anorthite.

However, by addition of CaO and $Al_2O_3$, a phenomenon such that the through hole conductor greatly protrudes appeared.

In order to suppress protrusion of the through hole conductor, matching of shrinkage behavior by firing between the through hole conductor and the green sheet is important. The present inventors have succeeded in making the shrinkage behavior closer to the through hole conductor by adding a small amount of an alkali component to the composition of the glass contained in the raw material powder (glass in after-mentioned Examples 10, 11 and 12).

However, in a case where the glass highly tends to crystallize, it was difficult to sufficiently suppress protrusion of the through hole conductor. The present inventors consider that this is because the volume shrinkage by crystallization of the glass is significant, whereby matching of the shrinkage with the through hole conductor is difficult.

Based on the above discoveries, the present inventors have found a glass composition which can make the amount of protrusion of the through hole conductor sufficiently small while the flexural strength is increased, and accomplished the present invention.

Effects of the Invention

According to the present invention, an LED package with which the amount of protrusion of a through hole conductor is sufficiently small, and which is excellent in the strength and heat dissipation properties, can efficiently be produced.

Further, mounting reliability can be improved, whereby an LED package having high dimensional accuracy can be obtained.

Further, an LED package having high acid resistance can be obtained.

Further, in a case where a substrate is prepared by co-firing a silver conductor and a green sheet, an LTCC substrate may be deformed, for example, warped. This is mainly because of a difference in the shrinkage amount due to firing between a silver conductor paste and a green sheet. Further, it is also considered as follows. By elution of silver ions into the glass, the glass composition at a portion in contact with the silver conductor is changed, and resultingly, a portion far from the silver conductor and a portion in contact with the silver conductor differ in the shrinkage behavior.

According to the present invention, it is possible to obtain such an LED package that even when the substrate is warped at the time of co-firing, its warpage is small.

Further, coloring (silver coloring) may occur by the reaction of silver with glass contained in the raw material powder for the LTCC. This is considered to be caused by silver colloids which are formed by reduction of silver ions, which are eluted from the silver conductor into glass.

According to the present invention, silver coloring will not occur or hardly occur at the time of co-firing with a silver conductor, the reflectance of the substrate can be increased, or coloring of the substrate can be suppressed.

BRIEF DESCRIPTION OF THE DRAWING

FIG. 1 is a cross-sectional view illustrating a conventional light emitting diode package.

BEST MODE FOR CARRYING OUT THE INVENTION

Now, the present invention will be described in detail, but it should be understood that the present invention is by no means restricted thereto.

The glass ceramic composition of the present invention (hereinafter referred to simply as a composition of the present invention) usually contains a powder of the above glass (hereinafter the glass to be used for the composition of the present invention will be referred to as glass of the present invention) and a ceramic filler (typically an alumina filler i.e. an alumina powder), or is formed into a green sheet comprising the above components.

In the present invention, preparation of a green sheet is carried out preferably as follows. That is, first, the composition of the present invention and a resin such as a polyvinyl butyral or an acrylic resin, and as the case requires, a plasticizer such as dibutyl phthalate, dioctyl phthalate or butylbenzyl phthalate, are mixed. Then, a solvent such as toluene, xylene or butanol is added to obtain a slurry, which is formed into a sheet by a doctor blade method or the like on a film of e.g. polyethylene terephthalate. Finally, the sheet-formed product is dried to remove the solvent thereby to obtain a green sheet.

On the above green sheet, as the case requires, a wiring pattern or a via as a through hole conductor, etc. are formed by e.g. screen printing using a silver paste, a silver conductor or the like.

The glass of the present invention is suitable as glass for a substrate of a light emitting diode package.

The above green sheet is fired and then processed into a desired shape to obtain a substrate. In such a case, one green sheet or a plurality of green sheets laminated are fired. The substrate is a substrate for the LED package of the present invention, and firing is typically carried out by holding the green sheet(s) at from 850 to 900° C. for from 20 to 60 minutes. The firing temperature is more typically from 860 to 880° C.

In a case where a wiring pattern or a through hole conductor is formed in the interior of the fired product i.e. the substrate by co-firing with a silver paste or the like, the firing temperature is preferably at most 880° C. If the firing temperature exceeds 880° C., silver or the silver-containing conductor may be softened at the time of firing, whereby the shape of the wiring pattern or the through hole conductor may not be maintained, and the firing temperature is more preferably at most 870° C.

The composition of the present invention is preferably such that even when it is fired at a temperature of at most 900° C., a dense fired product is obtained, whereby it can be co-fired with a conductor material such as a silver paste at a temperature of at most 900° C.

The composition of the present invention preferably contains, as represented by mass percentage, from 25 to 55% of the powder of the glass of the present invention and from 45 to 75% of a ceramic filler. If the content of the powder of the glass of the present invention is less than 25%, it may be difficult to obtain a dense fired product by firing, and it is preferably at least 35%. Further, if the content of the powder of the glass exceeds 55%, the strength may be insufficient, and it is preferably at most 50%, more preferably at most 45%.

The ceramic filler is a component to increase the strength of the substrate. Its content is more preferably at least 50%, particularly preferably at least 55%. If the content of the ceramic filler exceeds 75%, it will be difficult to obtain a dense fired product by firing, or smoothness on the surface of the substrate may be impaired, and it is preferably at most 65%.

The composition of the present invention may contain as other component an inorganic powder such as a heat resistant pigment within a range not to impair the object of the present invention. In such a case, the content of such other component is typically at most 5% in total.

The ceramic filler as a component of the composition of the present invention is typically an alumina powder. By incorporating the alumina powder, the strength of the substrate can be increased. In order to increase the strength of the substrate, the alumina powder is contained preferably in an amount of at least 30%.

Further, in order to make the after-mentioned reflectance of the substrate particularly high, the composition of the present invention more preferably contains a powder of a high refractive index ceramic having a refractive index higher than 2. Such a high refractive index ceramic may, for example, be titania or zirconia. In order to make the reflectance high, the content of a zirconia powder is preferably at least 5%, more preferably at least 10%. In such a case, the alumina powder is contained preferably in an amount of at least 30%.

The 50% particle size ($D_{50}$) of the ceramic filler is preferably from 0.5 to 5 μm. If $D_{50}$ is less than 0.5 μm, for example, it will be difficult to uniformly disperse the powder in the green sheet. Otherwise, the powder is likely to agglomerate, and accordingly its handling will be difficult. $D_{50}$ is more preferably at least 1 μm. If $D_{50}$ exceeds 5 μm, a dense fired product will hardly be obtained, and it is more preferably at most 3 μm.

The powder of the glass of the present invention as a component of the composition of the present invention is usually produced by grinding glass obtained by a melting method. The grinding method is not particularly limited so long as the object of the present invention is not impaired, and may be either wet grinding or dry grinding. In the case of wet grinding, it is preferred to use water as a solvent. Further, for grinding, a grinding machine such as a roll mill, a ball mil or a jet mill may suitably be used. The glass after grinding is dried and classified as the case requires.

$D_{50}$ of the powder of the glass of the present invention as a component of the composition of the present invention is preferably from 0.5 to 5 μm. If $D_{50}$ is less than 0.5 μm, for example, it will be difficult to uniformly disperse the powder of the glass in the green sheet. Otherwise, the powder hardly agglomerate, and accordingly its handling will be difficult. $D_{50}$ is more preferably at least 1 μm. If $D_{50}$ exceeds 5 μm, a dense fired product will hardly be obtained, and it is more preferably at most 3 μm.

On the substrate of the present invention, at least one through hole conductor is provided for the purpose of heat dissipation and the like, and on at least one of said through hole conductor, an LED element is mounted.

Usually, the through hole conductor is a silver conductor containing as the main component silver having a high thermal conductivity, and co-firing is carried out preferably at a temperature of at most 900° C. The reason why the silver conductor is used is that silver has a high thermal conductivity and is excellent in heat dissipation properties.

The through hole conductor is typically formed by a method of forming a hole at a predetermined position on the green sheet, filling the hole with a conductor paste such as a silver paste, and laminating such green sheets, followed by firing. In such a case, the through hole conductor and the conductor paste for formation thereof preferably contain no inorganic component other than the conductor in order to increase the thermal conductivity.

In a case where a thermal via is provided on a portion of the substrate of the present invention on which the light emitting element is mounted, the conductor of the thermal via preferably protrudes from a surface on which the light emitting diode element is mounted. If the conductor of the thermal via makes a dent in the substrate surface, a gap will be formed between the conductor of the thermal via and the light emitting diode element, or the adhesive layer will be thick, whereby heat from the light emitting diode element may not effectively be dissipated to the conductor of the thermal via. The amount of protrusion of the conductor of the thermal via is preferably from 0 to 5 μm. If the amount of protrusion exceeds 5 μm so that the conductor of the thermal via greatly protrudes, a gap may be formed between the light emitting diode element and the substrate, whereby a large amount of an adhesive is used, thus lowering heat dissipation properties, or the light emitting diode element is inclined when mounted, whereby attachment to a predetermined position will be difficult.

The glass transition point (Tg) of the glass of the present invention is preferably from 550 to 700° C. If Tg is less than 550° C., an organic binder (resin) in the green sheet is difficult to remove, and if it exceeds 700° C., the shrinkage starting temperature at the time of firing will be high, whereby the dimensional accuracy of the insulating substrate may be decreased.

The glass of the present invention is preferably one which undergoes phase separation when fired at from 850 to 900° C. If it will not undergo phase separation, mechanical strength of a fired product may be decreased. One which undergoes phase separation typically means that when observed by a high resolution electron microscope, presence of a phase differing in the chemical composition can be confirmed, although it is difficult to detect crystals by X-ray diffraction.

Now, the component of glass of the present invention will be described. In the following description, the glass composition is represented by mole percentage unless otherwise specified.

$SiO_2$ is a glass network former and is essential. If the $SiO_2$ content is less than 57%, a stable glass is hardly obtained, or chemical durability will be decreased. E.g. in a case where acid resistance is to be increased, the $SiO_2$ content is preferably at least 58%, more preferably at least 59%, particularly preferably at least 60%. If the $SiO_2$ content exceeds 65%, the glass melting temperature or Tg may be too high, and it is preferably at most 64%, more preferably at most 63%.

$B_2O_3$ is a glass network former and is essential. If the $B_2O_3$ content is less than 13%, the glass melting temperature or Tg may be too high, and it is preferably at least 14%, more preferably at least 15%. If the $B_2O_3$ content exceeds 18%, a stable glass is hardly obtained, or the chemical durability may be decreased, and it is preferably at most 17%, more preferably at most 16%.

$Al_2O_3$ is a component to increase the stability, chemical durability or strength of the glass and is essential. If the $Al_2O_3$ content is less than 3%, the glass will be unstable, and it is preferably at least 4%, more preferably at least 5%. If the $Al_2O_3$ content exceeds 8%, the glass melting temperature or Tg may be too high, and it is preferably at most 7%, more preferably at most 6%.

CaO is a component to stabilize the glass, to decrease the glass melting temperature, or to facilitate precipitation of crystals at the time of firing, and is essential, and decreases Tg of the glass in some cases. If the CaO content is less than 9%, the glass melting temperature may be too high, and it is preferably at least 10%. E.g. in a case where it is desired to make glass be easily melted, the CaO content is preferably at least 12%, more preferably at least 13%, particularly preferably at least 14%. If the CaO content exceeds 23%, the glass may be unstable, and it is preferably at most 22%, more preferably at most 21%, particularly preferably at most 20%, typically at most 18%.

$Na_2O$ and $K_2O$ are components to decrease Tg, and at least one of them must be contained. If the total content ($Na_2O+K_2O$) is less than 0.5%, the glass melting temperature or Tg may be too high, and it is preferably at least 0.8%. If the total content of $Na_2O+K_2O$ exceeds 6%, chemical durability particularly acid resistance may be impaired, or the electrical insulating properties of the fired product may be decreased, and it is preferably at most 5%, more preferably at most 4%.

In a case where it is desired to prevent or suppress a protrusion formed by the through hole conductor, in a case where it is desired to increase the strength or the chemical durability, etc., it is preferred that the CaO content is at most 17%, the $Al_2O_3$ content is from 4 to 7 mol %, and the total content of $K_2O$ and $Na_2O$ is at most 4%.

The glass of the present invention essentially comprises the above components, but may contain other component within a range not to impair the object of the present invention. In a case where such other component is contained, the total content of such component is preferably at most 10%.

For example, $TiO_2$ may be contained for the purpose of decreasing the viscosity of a glass melt e.g. in some cases, and in such a case, the $TiO_2$ content is preferably at most 3%. Further, $ZrO_2$ may be contained for the purpose of improving stability of the glass, etc. in some cases, and in such a case, the $ZrO_2$ content is preferably at most 3%.

The glass of the present invention preferably contains no lead oxide.

EXAMPLES

Now, the present invention will be described in further detail with reference to Examples, but it should be understood that the present invention is by no means restricted thereto.

In Examples 1 to 6 shown in Table 1 and in Example 10 to 15 shown in Table 2, raw materials were blended and mixed so as to achieve a composition represented by mol % in sections from $SiO_2$ to $ZrO_2$, and the mixed raw materials were put in a platinum crucible and melted at from 1,550 to 1,600° C. for 60 minutes, and then the molten glass was cast and cooled. The obtained glass was ground by a ball mill made of alumina using ethyl alcohol as a solvent for from 20 to 60 hours to obtain a powder of the glass.

Examples 1 to 6 are Examples of the present invention, and Examples 10 to 15 are Comparative Examples. Examples 7 to 9 are also Examples of the present invention, but no preparation of a powder of the glass as described above was carried out.

$D_{50}$ (unit: μm) of each powder of the glass (Examples 1 to 6 and Examples 10 to 15) was measured by SALD2100, manufactured by Shimadzu Corporation, and it was 2.5 μm in each Example.

Further, Tg (unit: ° C.) and the softening point Ts (unit: ° C.) of each powder of the glass were measured using a thermal analyzer (TG-DTA2000) manufactured by Mac Science at a temperature-increasing rate of 10° C./min up to 1,000° C. In Tables, in the sections Tg and Ts, "*" represents that Tg or Ts could not be measured by this method. Further, values in brackets in Tables are values estimated from the composition, and the same applies to the after-mentioned H and flexural strength.

With 50 g of a powder having, as represented by mass percentage, 40% of each glass powder and 60% of alumina filler AL-45H manufactured by Showa Denko K.K. mixed, 15 g of an organic solvent (a mixture of toluene, xylene, 2-propanol and 2-butanol in a mass ratio of 4:2:2:1), 2.5 g of a plasticizer (di-2-ethylhexyl phthalate), 5 g of a resin (polyvinyl butyral PVK #3000K manufactured by DENKA) and a dispersing agent (DISPER BYK180 manufactured by BYK Japan K.K.) were mixed to prepare a slurry. This slurry was applied on a PET film by a doctor blade method, and the coating film was dried to obtain a green sheet having a thickness of 0.2 mm.

A via paste (conductor paste) was prepared in such a manner that an electrically conductive powder (spherical silver powder having an average particle size of 5 μm manufactured by DAIKEN CHEMICAL CO., LTD.) and a vehicle (ethyl cellulose) were prepared in a mass ratio of 85:15 and dispersed in a solvent (α-terpineol) so that the concentration of the solid content became 85% as represented by mass percentage, and then kneaded in a porcelain mortar for 1 hour, followed by dispersion by three rolls three times.

A hole having a diameter of 0.3 mm was punched through the above obtained green sheet by a punch to form a via hole. The via hole was filled with the above prepared via paste by screen printing method. Then, six such green sheets were laminated and held at 550° C. for 5 hours to remove the resin component by decomposition, and then held at 870° C. for 30 minutes to carry out firing. The obtained fired product (insulating substrate) was observed by an electron microscope (S3000H manufactured by Hitachi High-Technologies Corporation), and the height of the protrusion of the conductor via i.e. the through hole conductor was measured on five points. The average of the measured results at five points is shown in the section H in Table 1 (unit: μm). H is preferably at most 5 μm. If H exceeds 5 μm, the LED chip will be inclined when mounted, whereby the quantity of light may be decreased.

The flexural strength was measured by the following method. That is, six such green sheets were laminated and held at 550° C. for 5 hours to remove the resin component by decomposition, and then held at 870° C. for 30 minutes to carry out firing to prepare a fired product for measuring the flexural strength. The fired product was cut into strips having a thickness of about 0.85 mm and a width of 5 mm, and 10 such strips were used to measure three-point flexural strength (measuring apparatus: INSTRON 8561 manufactured by Instron). The span was 15 mm, and the cross head speed was 0.5 cm/min. The measurement results are shown in the section of strength in Tables 1 and 2 (unit: MPa). The flexural strength is preferably at least 250 MPa.

TABLE 2

|  | Ex. 9 | Ex. 10 | Ex. 11 | Ex. 12 | Ex. 13 | Ex. 14 | Ex. 15 |
|---|---|---|---|---|---|---|---|
| $SiO_2$ | 64.0 | 56.3 | 60.0 | 60.5 | 65.5 | 75.3 | 81.6 |
| $B_2O_3$ | 16.0 | 15.3 | 12.5 | 16.0 | 16.0 | 14.2 | 16.6 |
| CaO | 10.0 | 20.0 | 18.0 | 20.0 | 12.5 | 3.0 | 0 |
| $Al_2O_3$ | 5.0 | 8.0 | 6.0 | 2.5 | 6.0 | 6.0 | 0 |
| $K_2O$ | 2.0 | 0.4 | 1.0 | 0.5 | 0 | 1.5 | 1.8 |
| $Na_2O$ | 3.0 | 0 | 0.5 | 0.5 | 0 | 0 | 0 |
| $TiO_2$ | 0 | 0 | 0 | 0 | 0 | 0 | 0 |
| $ZrO_2$ | 0 | 0 | 0 | 0 | 0 | 0 | 0 |
| Tg | (650) | 684 | 675 | 685 | * | * | 495 |
| Ts | (900) | 799 | * | * | * | * | 775 |
| H | (0) | 13 | 11 | 10 | 15 | 20 | 0 |
| Strength | (280) | 240 | 220 | 230 | 250 | 220 | 190 |

A green sheet was prepared in the same manner as above using a mixed powder having the same glass powder as in Example 2, the above alumina powder AL-45H and zirconia powder HSY-3F-J manufactured by Daiichi Kigenso Kagaku Kogyo Co., Ltd. mixed in a ratio as shown in the section of glass powder, the section of alumina powder and the section of zirconia powder in Table 3 as represented by mass percentage. Six such green sheets were laminated, and held at 550° C. for 5 hours to remove the resin component. Then, firing was carried out by holding the laminate at 885° C. for 30 minutes in Example 2A, or at 875° C. for 30 minutes in Examples 2B, 2C, 2D and 2E to prepare a fired product, and the flexural strength was measured by the above method. The measurement results are shown in the section of strength in Table 3 together with the results in Example 2 (unit: MPa). From the results, it is found that in a case where it is desired to make the flexural strength be at least 250 MPa by using the glass in Example 2, the composition of the present invention preferably contains, as represented by mass percentage, from 25 to 55% of a powder of the glass and from 45 to 75% of a ceramic filler.

Further, the reflectance was measured by the following method. The above obtained green sheets were laminated and fired to obtain a fired product in the form of an about 30 mm square with a thickness of about 300 μm. The reflectance of the obtained fired product was measured by using a spectroscope USB2000 manufactured by Ocean Optics Inc. and a small integrating sphere ISP-RF manufactured by Ocean Optics Inc to calculate the reflectance (unit: %) at a wavelength of 460 nm assuming the reflectance of a barium sulfate standard plate as 100. The results are shown in Table 3.

In a case where there are conditions for use such that it is desired to make the substrate thin, the reflectance is preferably at least 85%. In Example 2C, a high reflectance was

TABLE 1

|  | Ex. 1 | Ex. 2 | Ex. 3 | Ex. 4 | Ex. 5 | Ex. 6 | Ex. 7 | Ex. 8 |
|---|---|---|---|---|---|---|---|---|
| $SiO_2$ | 62.6 | 60.4 | 58.5 | 64.5 | 58.0 | 62.0 | 64.0 | 58.0 |
| $B_2O_3$ | 15.6 | 15.6 | 17.5 | 16.5 | 17.0 | 14.0 | 16.0 | 15.0 |
| CaO | 15.0 | 15.0 | 13.0 | 10.0 | 13.5 | 15.0 | 13.0 | 18.0 |
| $Al_2O_3$ | 6.0 | 6.0 | 6.0 | 6.0 | 6.0 | 6.0 | 4.0 | 6.0 |
| $K_2O$ | 0.8 | 1.0 | 1.0 | 1.0 | 1.0 | 1.5 | 1.0 | 1.0 |
| $Na_2O$ | 0 | 2.0 | 2.0 | 2.0 | 2.0 | 1.5 | 2.0 | 2.0 |
| $TiO_2$ | 0 | 0 | 0 | 0 | 2.5 | 0 | 0 | 0 |
| $ZrO_2$ | 0 | 0 | 2.0 | 0 | 0 | 0 | 0 | 0 |
| Tg | 656 | 640 | 644 | 690 | 638 | 652 | (650) | (700) |
| Ts | * | 760 | 827 | 833 | 837 | 857 | (750) | (820) |
| H | 5 | 0 | 3 | 3 | 5 | (4) | (1) | (2) |
| Strength | 260 | 290 | 285 | 273 | 280 | (260) | (270) | (280) | obtained. If the reflectance is less than 85%, leakage of light may be significant when the substrate is made thin.

TABLE 3

|  | Ex. 2 | Ex. 2A | Ex. 2B | Ex. 2C | Ex. 2D | Ex. 2E |
|---|---|---|---|---|---|---|
| Glass powder | 40 | 30 | 50 | 35 | 38 | 60 |
| Alumina powder | 60 | 70 | 50 | 33 | 54 | 40 |
| Zirconia powder | 0 | 0 | 0 | 32 | 9 | 0 |
| Strength | 290 | 250 | 280 | 260 | 280 | 200 |
| Reflectance | 75 | 84 | 75 | 95 | 85 | 71 |

INDUSTRIAL APPLICABILITY

The light emitting diode package of the present invention is useful for application to illumination devices such as a high brightness (HB) photodiode backlight, a light source related to displays, automobile illumination, decorative illumination, sign and advertisement illumination and an information display, and is particularly useful for a backlight of a mobile phone or a large-sized liquid crystal TV, etc.

The entire disclosure of Japanese Patent Application No. 2008-108953 filed on Apr. 18, 2008 including specification, claims, drawings and summary is incorporated herein by reference in its entirety.

MEANING OF SYMBOLS

| 1: | Insulating substrate |
|---|---|
| 1a, 1b: | Principal plane |
| 3a, 3b: | Connection terminal |
| 5: | External electrode terminal |
| 7: | Via conductor for current application |
| 9: | Mounting portion |
| 10: | Thermal via (through hole conductor) |
| 21: | LED element |
| 23: | Bonding wire |
| 25: | Light emitting device |
| 29: | Adhesive |
| 31: | Mold material |

What is claimed is:

1. A light emitting diode package comprising a light emitting diode element mounted on a substrate, wherein the substrate is obtained by firing a glass ceramic composition containing a powder of glass containing, as represented by mole percentage, from 57 to 65% of $SiO_2$, from 13 to 18% of $B_2O_3$, from 9 to 23% of CaO, from 3 to 8% of $Al_2O_3$ and from 0.5 to 6% of at least one of $K_2O$ and $Na_2O$ in total, and a ceramic filler.

2. The light emitting diode package according to claim 1, wherein the glass contains at least 58 mol % of $SiO_2$.

3. The light emitting diode package according to claim 1, wherein the glass contains at least 12 mol % of CaO.

4. The light emitting diode package according to claim 1, wherein the glass contains at most 17 mol % of CaO, from 4 to 7 mol % of $Al_2O_3$, and at most 4% of $K_2O$ and $Na_2O$ in total.

5. The light emitting diode package according to claim 1, wherein the ceramic filler is an alumina powder.

6. The light emitting diode package according to claim 5, wherein the ceramic filler contains an alumina powder and a zirconia powder.

7. The light emitting diode package according to claim 1, wherein the glass ceramic composition contains, as represented by mass percentage, from 25 to 55% of the powder of glass and from 45 to 75% of the ceramic filler.

8. The light emitting diode package according to claim 7, wherein the glass ceramic composition contains, as represented by mass percentage, at least 30% of an alumina powder.

9. The light emitting diode package according to claim 8, wherein the glass ceramic composition contains, as represented by mass percentage, at least 5% of a zirconia powder.

10. The light emitting diode package according to claim 1, wherein at least one through hole conductor is provided on the substrate, and the light emitting diode element is mounted on at least one of said through hole conductor.

11. The light emitting diode package according to claim 10, wherein a heatsink is formed on the other side of the substrate opposite to the side where the light emitting diode element is mounted, and at least one of the through hole conductor on which the light emitting diode element is mounted is a thermal via connected to the heatsink.

12. The light emitting diode package according to claim 11, wherein the conductor of the thermal via protrudes from the side of the substrate on which the light emitting diode element is mounted, and the amount of protrusion is at most 5 μm.

13. The light emitting diode package according to claim 1, wherein the flexural strength of the substrate is at least 250 MPa.

* * * * *